United States Patent
Kohtani (10) Patent No.: US 9,209,749 B2
(45) Date of Patent: Dec. 8, 2015

(54) MULTIPLIER CIRCUIT AND WIRELESS COMMUNICATION APPARATUS USING THE SAME

(71) Applicant: Samsung Electronics Co., Ltd., Gyeonggi-do (KR)

(72) Inventor: Masato Kohtani, Kanagawa (JP)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 14/101,803

(22) Filed: Dec. 10, 2013

(65) Prior Publication Data

US 2014/0162577 A1   Jun. 12, 2014

(30) Foreign Application Priority Data

Dec. 10, 2012   (JP) .................................. 2012269351
Jun. 19, 2013   (KR) ........................ 10-2013-0070139

(51) Int. Cl.
*H04B 1/04*   (2006.01)
*H03D 7/12*   (2006.01)

(52) U.S. Cl.
CPC ............. *H03D 7/125* (2013.01); *H04B 1/0475* (2013.01); *H03D 2200/0021* (2013.01)

(58) Field of Classification Search
CPC ........................ H03D 7/125; H03D 2200/0021
USPC ................... 327/119, 355, 356; 455/118, 333
See application file for complete search history.

(56) References Cited

U.S. PATENT DOCUMENTS

| | | | | |
|---|---|---|---|---|
| 4,403,156 | A * | 9/1983 | Sakamoto | 327/113 |
| 5,592,131 | A * | 1/1997 | Labreche et al. | 332/103 |
| 5,864,255 | A * | 1/1999 | Kwok et al. | 327/359 |
| 6,861,891 | B2 * | 3/2005 | Romano | 327/355 |
| 8,594,609 | B2 * | 11/2013 | Garcia et al. | 455/323 |
| 2004/0257129 | A1 * | 12/2004 | Kwok | 327/116 |
| 2006/0255872 | A1 * | 11/2006 | Hino | 331/177 V |
| 2006/0291322 | A1 * | 12/2006 | Crippa et al. | 365/230.06 |
| 2007/0217271 | A1 * | 9/2007 | Kutz et al. | 365/189.09 |
| 2009/0174494 | A1 * | 7/2009 | Kobayashi et al. | 332/109 |
| 2010/0271148 | A1 * | 10/2010 | Kobayashi et al. | 332/106 |
| 2010/0328252 | A1 * | 12/2010 | Chang et al. | 345/174 |

FOREIGN PATENT DOCUMENTS

JP    2007158803    6/2007

* cited by examiner

*Primary Examiner* — Duc M Nguyen
(74) *Attorney, Agent, or Firm* — The Farrell Law Firm, P.C.

(57) ABSTRACT

A multiplier circuit and wireless communication apparatus that adjust an output level of a desired multiple wave to a desired range is provided. The multiplier circuit includes a multiple wave output unit configured to receive an input signal of a predetermined frequency, to output a multiple wave that is a predetermined multiple of the input signal, and control harmonic distortion associated with the output of the multiple wave based on a gate-source voltage; and a controller configured to adjust the gate-source voltage.

8 Claims, 10 Drawing Sheets

|  | TRANSISTOR M1 | SUB TRANSISTOR M2 |
|---|---|---|
| CHANNEL WIDTH OF EACH FINGER [um] | 2 | 2 |
| CHANNEL LENGTH [nm] | 60 | 60 |
| FINGER NUMBER | 20 | 5 |
| TOTAL CHANNEL WIDTH [um] | 40 | 10 |
| CONTROLLABLE LENGTH OF GATE-SOURCE VOLTAGE VGS [V] | 0.2 ~ 0.8 (Default = 0.45) | 0/0.5 |
| DRAIN CURRENT [mA] | 2.105 (Vgs = 0.45 [V]) | 0.784 (Vgs = 0.5 [V]) |

MULTIPLIER CIRCUIT AND WIRELESS COMMUNICATION APPARATUS USING THE SAME

PRIORITY

This application claims priority under 35 U.S.C. §119(a) to Japanese Patent Application Serial No. 2012-269351, which was filed in the Japanese Patent Office on Dec. 10, 2012, and Korean Patent Application Serial No. 10-2013-0070139, which was filed in the Korean Intellectual Property Office on Jun. 19, 2013, the entire disclosure of each of which is hereby incorporated by reference.

BACKGROUND OF THE INVENTION

1. Field of the Invention

The present invention relates generally to a multiplier circuit, and a wireless communication apparatus using the same.

2. Description of the Related Art

It is often difficult to design a semiconductor integrated circuit capable of outputting high frequency carrier waves. For example, when a circuit using a millimeter wave band of 80 GHz is designed, design parameters often approach values of parasitic elements, resulting in a high difficulty level of design because the influence of the parasitic elements should be considered in the design.

For this reason, a multiplier circuit capable of outputting a multiple wave (harmonics) having a frequency that is an integer multiple of a frequency of an input signal using a nonlinear element, such as a transistor, has attracted attention. By using the multiplier circuit, it is possible to maintain a signal (i.e., an input signal) output from an oscillator at a low frequency, and also to lower a difficulty level of design for outputting high-frequency signals. For example, Japanese Laid-open Patent Application No. 2007-158803 describes an example of a frequency multiplier using a multiplier circuit.

Wireless communication apparatuses that output high-frequency signals are required to switch the output level or frequency of carrier waves according to a reception environment or applications. Therefore, in order to realize a wireless communication apparatus with a relatively low difficulty level of design, a multiplier circuit capable of adjusting the output level of a multiple wave (hereinafter, referred to as a "desired multiple wave") multiplied by a desired multiplication number to a desired range is needed.

SUMMARY OF THE INVENTION

Different aspects of the present invention are provided to address at least the above-described problems and/or disadvantages of the related art and to provide at least the advantages described below.

Accordingly, an aspect of the present invention is to provide a multiplier circuit capable of adjusting an output level of a desired multiple wave to a desired range.

Another aspect of the present invention is to provide a wireless communication apparatus including a multiplier circuit capable of adjusting the output level of a desired multiple wave to a desired range.

In accordance with an aspect of the present invention, a multiplier circuit is provided, which includes a multiple wave output unit configured to receive an input signal of a predetermined frequency, to output a multiple wave that is a predetermined multiple of the input signal, and control harmonic distortion associated with the output of the multiple wave based on a gate-source voltage; and a controller configured to adjust the gate-source voltage.

In accordance with another aspect of the present invention, a wireless communication apparatus is provided, which includes an oscillator configured to output an input signal of a predetermined frequency; a multiple wave output unit configured to receive the input signal, to output a multiple wave that is a predetermined multiple of the input signal, and to control harmonic distortion associated with the output of the multiple wave based on a gate-source voltage; a controller configured to adjust the gate-source voltage; and a modulator configured to modulate a desired base-band signal using the multiple wave as a carrier wave.

BRIEF DESCRIPTION OF THE DRAWINGS

The above and other aspects, features, and advantages of certain embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EMBODIMENTS OF THE INVENTION

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Figure 1:
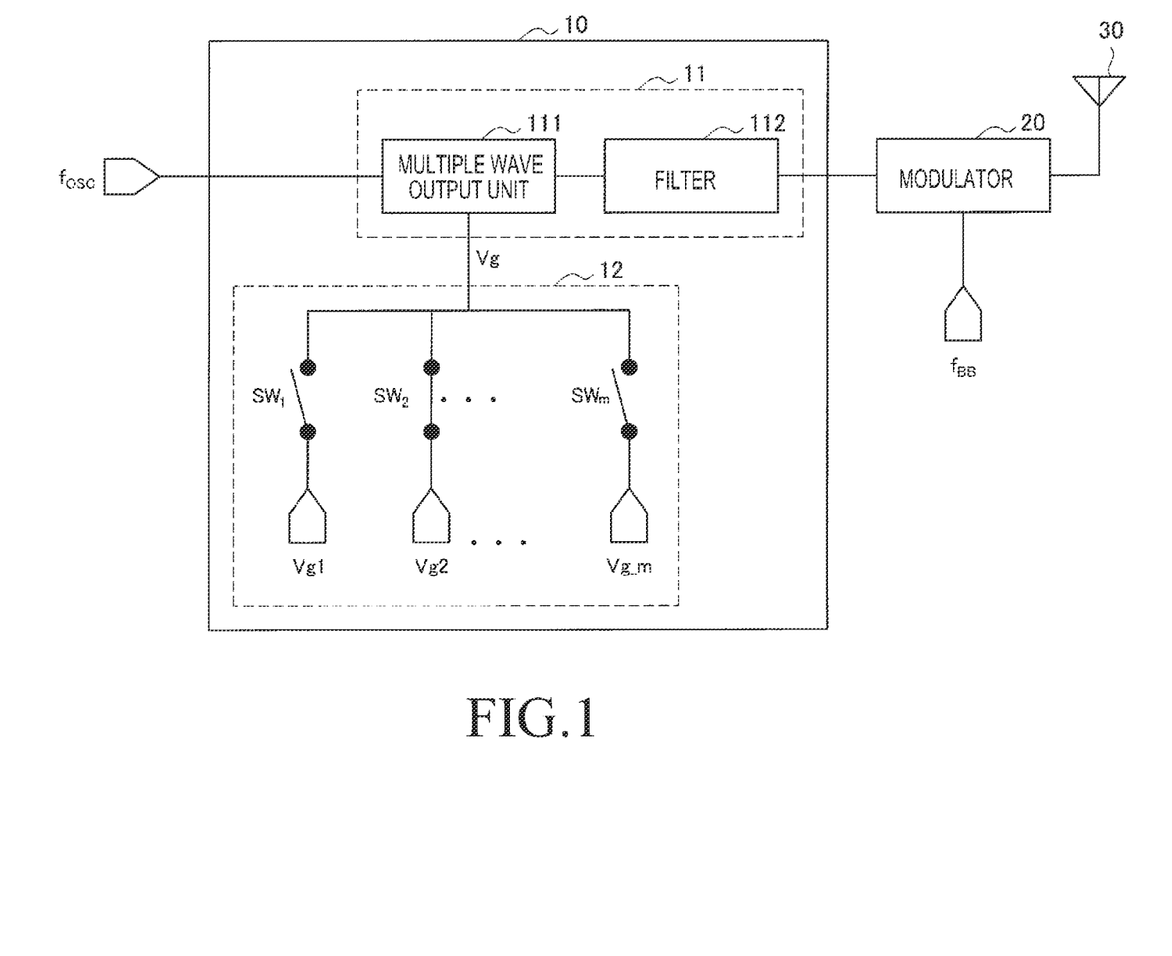
FIG. 1 illustrates a wireless communication apparatus according to an embodiment of the present invention.

FIG. 1 illustrates a wireless communication apparatus according to an embodiment of the present invention.

Referring to FIG. 1, the wireless communication apparatus includes a frequency multiplier 10, a modulator 20, and a transmitter 30. The frequency multiplier 10 includes a multiplier circuit 11 and a harmonic distortion controller 12. The multiplier circuit 11 includes a multiple wave output unit 111 and a filter 112.

The multiple wave output unit 111 receives an input signal including a frequency component of a predetermined frequency. The input signal may be generated by an oscillator, e.g., a Voltage Controlled Oscillator (VCO) that can change an oscillation frequency. Herein, the frequency component included in the input signal will be referred to as a "reference wave fOSC".

The multiple wave output unit 111 includes a transistor, which will be described in detail below. A harmonic distortion control voltage Vg is applied to the transistor of the multiple wave output unit 111, wherein the harmonic distortion control voltage Vg is applied as a gate-source voltage to the transistor of the multiple wave output unit 111. Harmonic distortion of the transistor included in the multiple wave output unit 111 varies depending on the harmonic distortion control voltage Vg. As harmonic distortion of the transistor changes, the output level of a harmonic component (i.e., a multiple wave) of an input signal changes. That is, by controlling the harmonic distortion control voltage Vg applied from the harmonic distortion controller 12, a multiple wave, which is a desired multiple of an input signal that can be adjusted to a desired value. Herein, it is assumed that the output level of a multiple wave n*fOSC, the fOSC multiplied by a predetermined multiplication number n (where n≥2), is adjusted to a desired value by the multiple wave output unit 111.

The multiple wave output unit 111 adjusts the output level of the multiple wave n*fOSC, and then outputs the resultant input signal to the filter 112.

The harmonic distortion controller 12 applies a harmonic distortion control voltage Vg to the multiple wave output unit 111 to adjust harmonic distortion of the multiple wave output unit 111 to a value corresponding to the harmonic distortion control voltage Vg.

The harmonic distortion controller 12 may change the harmonic distortion control voltage Vg.

The harmonic distortion controller 12 includes a plurality of switches $SW_1$ through $SW_m$, and different voltages Vg_1 through Vg_m are respectively applied to lines that are connected or disconnected by the on-off operations of the switches $SW_1$ through $SW_m$. By turning on/off the switches $SW_1$ through $SW_m$, a voltage applied to a line having a turned-on switch among the voltages Vg_1 through Vg_m is supplied as a harmonic distortion control voltage Vg to the multiple wave output unit 111. However, the configuration illustrated in FIG. 1 is merely an example, and other configurations of the harmonic distortion controller 12 may be used, as long as they can control a harmonic distortion control voltage Vg that is to be applied to the multiple wave output unit 111. The harmonic distortion controller 12 is an example of a "controller". Further, the frequency multiplier 10 in which the harmonic distortion controller 12 is included in the multiplier circuit 11 may be simply referred to as a "multiplier circuit".

The filter 112 receives the input signal having the adjusted output level of the multiple wave n*fOSC from the multiple wave output unit 111. The filter 112 passes a frequency component (for example, the multiple wave n*fOSC) that is used as at least a carrier wave among frequency components included in the input signal. Further, the filter 112 may remove other components, except for the frequency component that is used as a carrier wave. For example, the filter 112 may pass the multiple wave n*fOSC that is used as a carrier wave, and remove the reference wave fOSC, which is a source of the multiple wave n*fOSC in order to prevent the reference wave fOSC from being used as a carrier wave.

In the following description, it is assumed that the filter 112 passes the multiple wave n*fOSC. Thereafter, the filter 112 outputs the filtered signal, i.e., the multiple wave n*fOSC to the modulator 20. The filtered signal output from the filter 112 will be referred to as an "output signal".

The modulator 20 receives the output signal, i.e., the multiple wave n*fOSC of the predetermined frequency from the filter 112. The multiple wave n*fOSC is a multiple wave generated by multiplying the reference wave fOSC by the predetermined multiplication number n, and the output level of the multiple wave n*fOSC has been adjusted by the multiple wave output unit 111. The modulator 20 receives a base-band signal fBB, which is generated based on data that is to be transmitted. The modulator 20 modulates the base-band signal fBB using the multiple wave n*fOSC as a carrier wave to generate a modulated signal fTX, and outputs the modulated signal fTX to the transmitter 30. The transmitter 30 transmits the modulated signal fTX to a predetermined target.

Figure 2:
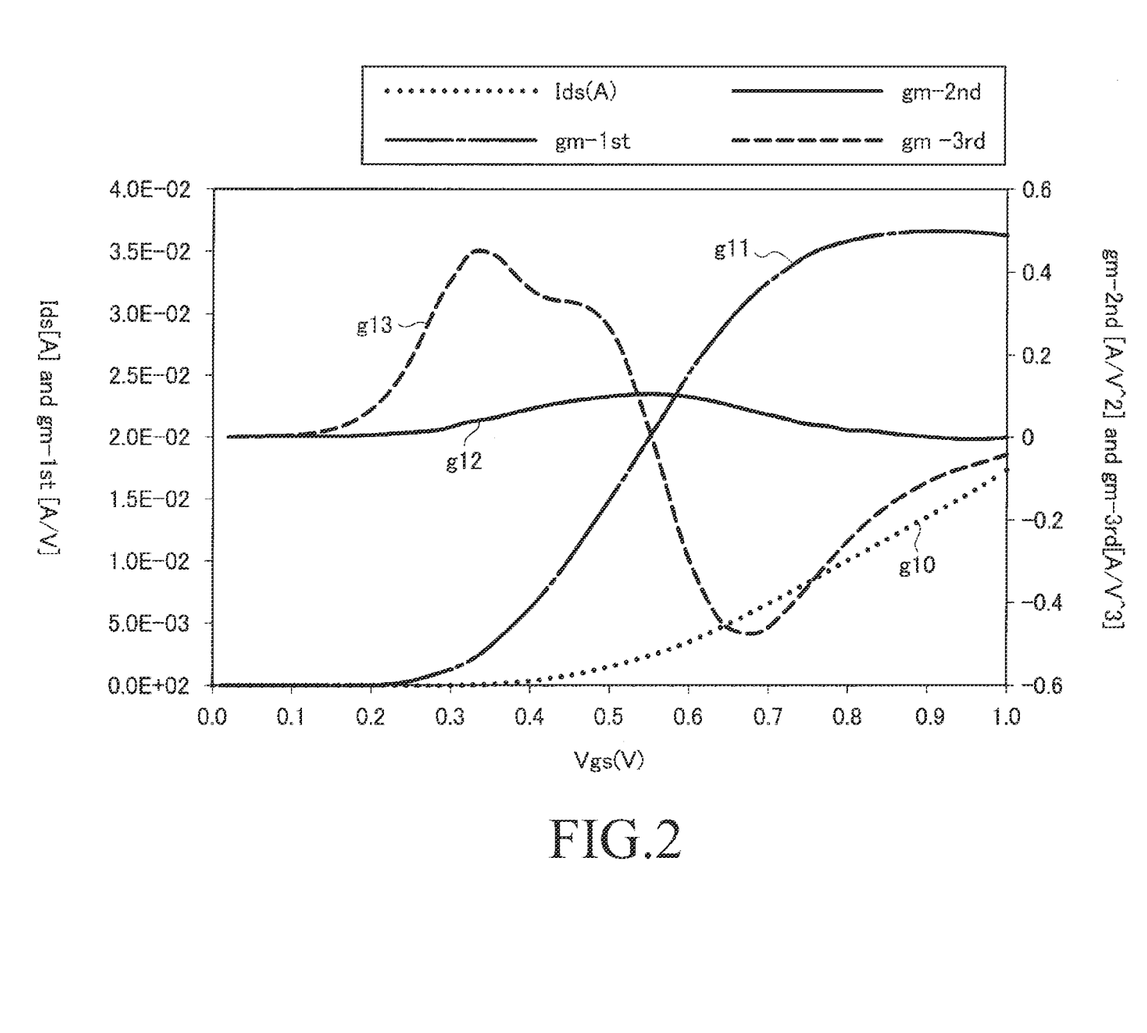
FIG. 2 is a graph illustrating changes of harmonic distortion coefficients of a transistor with respect to changes of a gate-source voltage.

FIG. 2 is a graph illustrating changes of harmonic distortion coefficients of a transistor with respect to changes of a gate-source voltage. Specifically, FIG. 2 is a graph illustrating changes of harmonic distortion coefficients of a transistor with respect to changes of a gate-source voltage, wherein the transistor is a MOS transistor having a channel length of 60 nm (L=60 nm) and a channel width of 40 um (W=40 um).

Referring to FIG. 2, the horizontal axis represents a gate-source voltage Vgs[V] that is applied to the transistor. The gate-source voltage Vgs corresponds to the harmonic distortion control voltage Vg of the multiplier circuit 11.

Graph g10 represents changes of drain-source current Ids [A] with respect to changes of the gate-source voltage Vgs, and graph g11 represents changes of a harmonic distortion coefficient gm-$1^{st}$ [A/V] of $1^{st}$ harmonics (i.e., a reference wave) with respect to changes of the gate-source voltage Vgs. The harmonic distortion coefficient represents an amplification rate of harmonic distortion. Graph g12 represents changes of a harmonic distortion coefficient gm-$2^{nd}$ [A/V2] of $2^{nd}$ harmonics with respect to changes of the gate-source voltage Vgs, and graph g13 represents changes of a harmonic distortion coefficient gm-$3^{rd}$ [A/V3] of $3^{rd}$ harmonics with respect to changes of the gate-source voltage Vgs.

As illustrated in FIG. 2, the graph g12 has an extreme value at near a gate-source voltage Vgs of 0.55V, and at this point, the harmonic distortion coefficient gm-$2^{nd}$ of $2^{nd}$ harmonics becomes a maximum. That is, the graph g12 shows that the amplitude value of the $2^{nd}$ harmonics (i.e., a frequency-doubled wave multiplied by a multiplication number 2) can be changed by adjusting the gate-source voltage Vgs in the range of 0.0V to 1.0V. Further, by setting Vgs=0.55V, $2^{nd}$ harmonics of a maximum amplitude value can be obtained.

The graph g13 has extreme values at near gate-source voltages Vgs of 0.65V and 0.35V. The harmonic distortion coefficient gm-$3^{rd}$ of $3^{rd}$ harmonics becomes a maximum in a minus (−) direction at near the gate-source voltage Vgs of 0.65V, and becomes a maximum in a plus (+) direction at near the gate-source voltage Vgs of 0.35V. Accordingly, the graph g13 shows that the amplitude value of the $3^{rd}$ harmonics (i.e., a frequency-tripled wave multiplied by a multiplication number 3) can be changed by adjusting the gate-source voltage Vgs in the range of 0.0V to 1.0V.

When only the amplitude values of harmonics are considered, without considering phase differences, harmonics having a same amplitude value can be obtained from plus (+) and minus (−) harmonic distortion coefficients having the same absolute value.

Specifically, referring to the graph g13, because near Vgs=0.65V and Vgs=0.35V, the absolute values of harmonic distortion coefficients are nearly the same, $3^{rd}$ harmonics having the same amplitude value can be obtained at near Vgs=0.65V and Vgs=0.35V. As a result, by setting a gate-source voltage Vgs to 0.35V, when there is no need to consider the influence of other harmonics, $3^{rd}$ harmonics having the same amplitude value as when Vgs=0.65V can be obtained while maintaining low consumption power. Although the example above relates to $2^{nd}$ and $3^{rd}$ harmonics, other harmonics, such as $5^{th}$ harmonics, can also be obtained in the same manner. Basically, by analyzing the characteristics of desired harmonics and adjusting a gate-source voltage Vgs according to the analyzed characteristics, the desired harmonics can be obtained.

Each harmonic distortion coefficient of the transistor changes according to a gate-source voltage Vgs. Therefore, the multiplier circuit 11 controls a gate-source voltage Vgs using the characteristics of the transistor to change harmonic distortion of the transistor, thereby adjusting the output level of desired harmonics that are output from the transistor to a desired value.

Figure 3A:
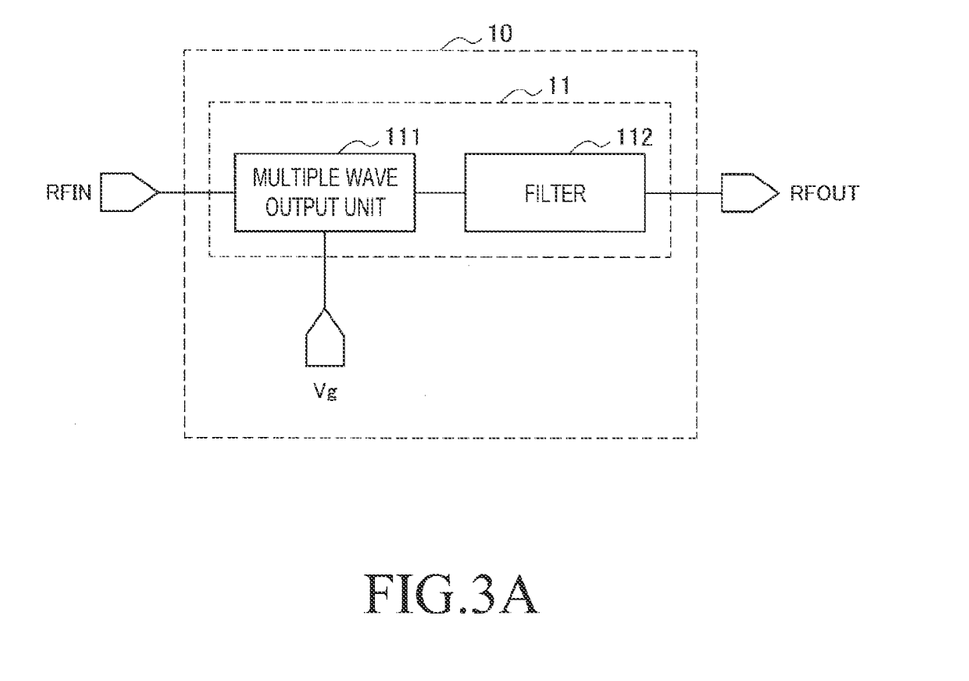
FIG. 3A illustrates a multiplier circuit according to an embodiment of the present invention.
Figure 3B:
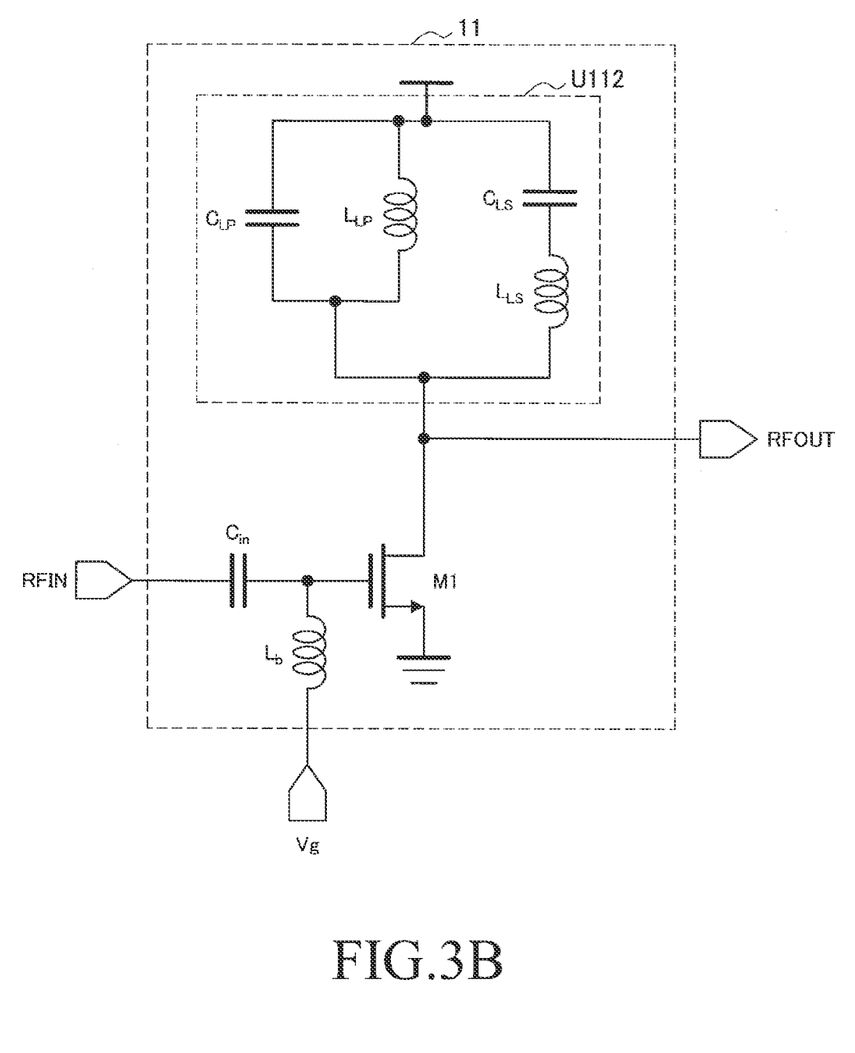
FIG. 3B illustrates a circuit diagram of a multiplier circuit according to an embodiment of the present invention.

FIG. 3A illustrates a multiplier circuit according to an embodiment of the present invention, and FIG. 3B illustrates a circuit diagram of a multiplier circuit according to an embodiment of the present invention.

Referring to FIG. 3B, the multiplier circuit 11 includes a transistor M1, e.g., a Metal Oxide Semiconductor (MOS) transistor. An input signal received through an input terminal RFIN is transferred to a gate of the transistor M1 via a capacitor $C_{in}$. The capacitor $C_{in}$ is disposed between the input terminal RFIN and the gate of the transistor M1 and blocks Direct Current (DC) components. That is, because DC components included in the input signal received through the input terminal RFIN are blocked, only Alternating Current (AC) components are transferred to the gate of the transistor M1. In addition, a harmonic distortion control voltage Vg generated by the harmonic distortion controller 12 (as illustrated in FIG. 1) is applied to the gate of the transistor M1 via an inductor $L_b$. The source of the transistor M1 is grounded. That is, the harmonic distortion control voltage Vg is applied as a gate-source voltage to the transistor M1. The inductor $L_b$ blocks high-frequency components that may be generated between the gate of the transistor M1 and the harmonic distortion controller 12.

As described above with reference to FIG. 2, if a harmonic distortion control voltage Vg is applied between the gate and source of the transistor M1, a harmonic distortion coefficient of the transistor M1 changes according to the harmonic distortion control voltage Vg. Accordingly, the amplitude value of each harmonic component included in the input signal transferred to the transistor M1 is adjusted according to the harmonic distortion coefficient, and the resultant signal is output to the drain of the transistor M1. That is, the transistor M1 (and circuits associated with inputs to or outputs from the transistor M1) is an example of a configuration corresponding to the multiple wave output unit 111 illustrated in FIG. 3A.

The drain of the transistor M1 is connected to a circuitry group U112 and an output terminal RFOUT.

The circuitry group U112 corresponds to the filter 112 illustrated in FIG. 3A. The circuitry group U112 includes a capacitor $C_{LS}$ and an inductor $L_{LS}$ (hereinafter, simply referred to as a "LC series circuit $C_{LS}L_{LS}$") that are connected in series to each other, and a capacitor $C_{LP}$ and an inductor $L_{LP}$ (hereinafter, simply referred to as a "LC parallel circuit $C_{LP}L_{LP}$") that are connected in parallel to each other.

The LC series circuit $C_{LS}L_{LS}$ removes a frequency component corresponding to a Self Resonance Frequency (SRF). For example, if the SRF of the LC series circuit $C_{LS}L_{LS}$ is set to the frequency of a reference wave fOSC, a frequency component corresponding to the reference wave fOSC can be removed from an input signal. In the following description, it is assumed that the LC series circuit $C_{LS}L_{LS}$ removes the frequency component corresponding to the reference wave fOSC.

The LC parallel circuit $C_{LP}L_{LP}$ acts to pass a frequency component corresponding to an SRF. Accordingly, for example, if the SRF of the LC parallel circuit $C_{LP}L_{LP}$ is set to the frequency of a multiple wave n*fOSC that is used as a carrier wave, a frequency component corresponding to a multiple wave n*fOSC, included in an input signal, can be selectively passed. In the following description, it is assumed that the LC parallel circuit $C_{LS}L_{LS}$ passes the frequency component corresponding to the multiple wave n*fOSC.

An input signal in which the output level of the multiple wave n*fOSC has been adjusted by the transistor M is filtered by the circuitry group U112. In FIG. 3B, a frequency component corresponding to the reference wave fOSC is removed, and a frequency component to the multiple wave n*fOSC is passed. The resultant filtered input signal is output through the output terminal RFOUT. That is, the multiple wave n*fOSC adjusted to a predetermined output level is output through the output terminal RFOUT. The multiple wave n*fOSC output through the output terminal RFOUT is input to the modulator 20, as illustrated in FIG. 1.

As described above, the frequency multiplier 10 controls a harmonic distortion control voltage Vg that is applied between the gate and source of the transistor M1 of the multiplier circuit 11, thereby adjusting the output level of a multiple wave n*fOSC to a desired value. Also, because the oscillation frequency (i.e., the frequency of the reference wave fOSC) of the oscillator can be maintained at a low frequency, a wireless communication apparatus capable of controlling the output level of a high frequency, such as 80 GHz, to a desired range can be provided with a relatively low difficulty level of design.

Figure 4A:
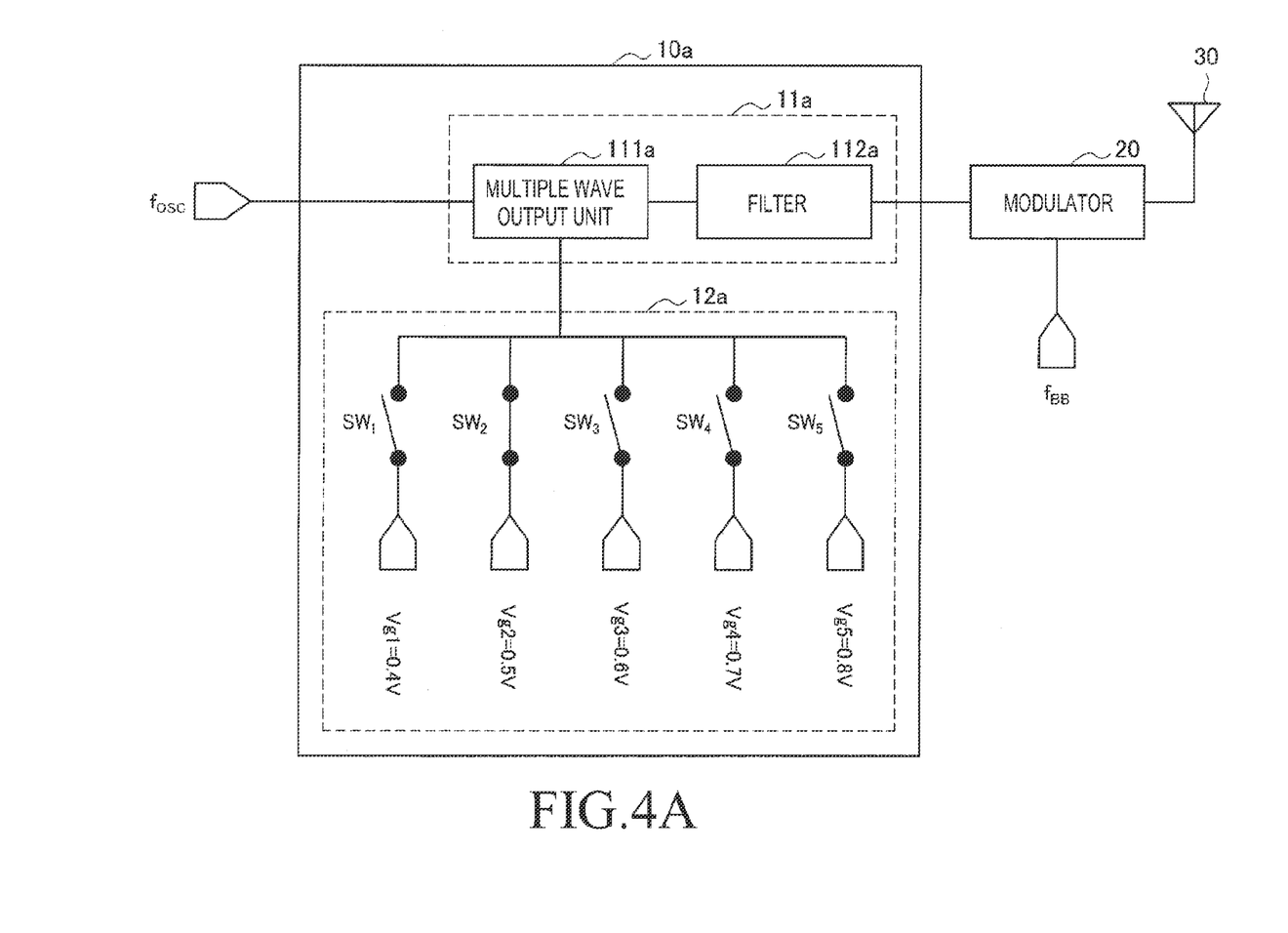
FIG. 4A illustrates a wireless communication apparatus according to an embodiment of the present invention.

FIG. 4A illustrates a wireless communication apparatus according to an embodiment of the present invention. Hereinafter, a configuration of a frequency multiplier 10a, which operates differently from the frequency multiplier 10 of FIG. 1 will be described, and detailed descriptions about the modulator 20 and the transmitter 30, which operate in the same manner as in FIG. 1 will be omitted.

Referring to FIG. 4A, the frequency multiplier 10a includes a multiplier circuit 11a and a harmonic distortion controller 12a. The multiplier circuit 11a has the same configuration as the multiplier circuit 11 of FIG. 3B. That is, the transistor M1 (and circuits associated with inputs to or outputs from the transistor M1), as illustrated in FIG. 3B, corresponds to a multiple wave output unit 111a of the multiplier circuit 11a, and the circuitry group U112 of FIG. 3B corresponds to a filter 112a of the multiplier circuit 11a. The transistor M1 corresponding to the multiple wave output unit 111a has a channel length of 60 nm (L=60 nm) and a channel width of 40 um (W=40 um).

The frequency multiplier 10a receives an input signal of a reference wave fOSC having a frequency of 40 GHz, and outputs a frequency-doubled wave 2*fOSC (80 GHz) multiplied by a multiplication number 2 (n=2). The filter 112a is adjusted to remove frequency components at or near 40 GHz corresponding to the reference wave fOSC, and to pass frequency components at or near 80 GHz corresponding to the frequency-doubled wave 2*fOSC.

The harmonic distortion controller 12a changes a harmonic distortion control voltage Vg in a pitch of 0.1V in the range of 0.4V to 0.8V. More specifically, as illustrated in FIG. 4A, the harmonic distortion controller 12a includes switches $SW_1$ through $SW_5$, which are respectively connected to lines to which different voltages Vg1 through Vg5 are respectively applied according to the on/off operations of the switches $SW_1$ through $SW_5$.

In FIG. 4A, Vg1=0.4V, Vg2=0.5V, Vg3=0.6V, Vg4=0.7V, and Vg5=0.8V. Accordingly, when the switch $SW_1$ is turned on, a harmonic distortion control voltage Vg1 of 0.4V is applied to the transistor M1 of the multiple wave output unit 111a from the harmonic distortion controller 12a. If the switches $SW_2$, $SW_3$, $SW_4$, and $SW_5$ are sequentially turned on, harmonic distortion control voltages Vg2 (0.5V), Vg3 (0.6V), Vg4 (0.7V), and Vg5 (0.8V) are sequentially applied to the transistor M1.

Figure 4B:
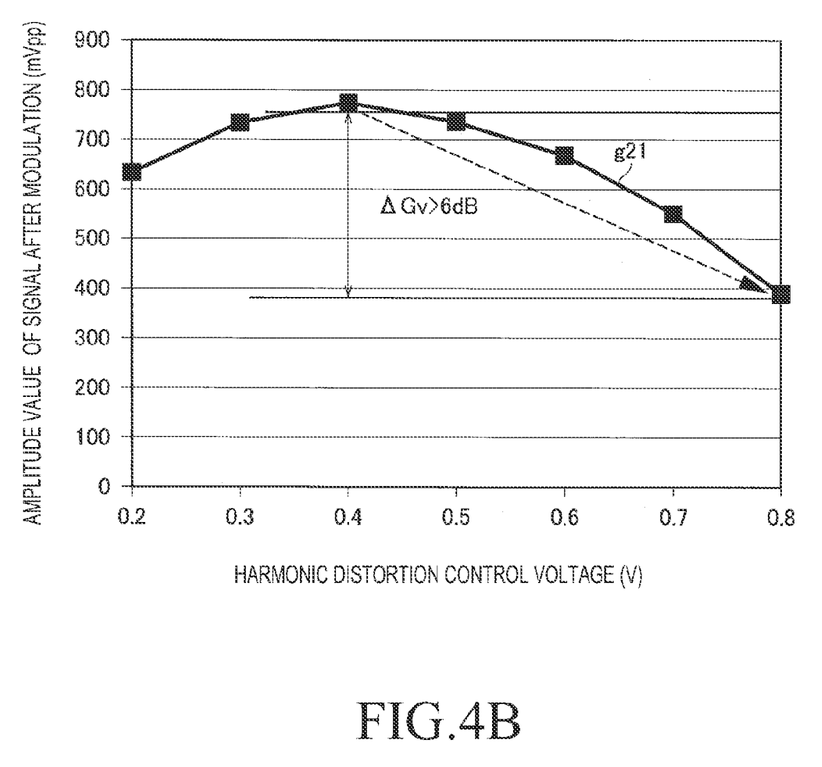
FIG. 4B is a graph illustrating changes in amplitude values of an output signal after modulation with respect to changes of a harmonic distortion control voltage in a wireless communication apparatus according to an embodiment of the present invention.

FIG. 4B is a graph g21 illustrating a relationship between a harmonic distortion control voltage Vg and an output signal fTX, after modulation, when changing the harmonic distortion control voltage Vg in a pitch of 0.1V in a wireless communication apparatus according to an embodiment of the present invention.

Referring to FIG. 4B, the vertical axis represents the amplitude value [mVpp] of the signal fTX after modulation, i.e., the amplitude value of a signal to which an output signal (a frequency-doubled wave 2*fOSC) of the frequency multiplier 10a has been modulated by the modulator 20. Further, the horizontal axis represents the harmonic distortion control voltage Vg.

FIG. 4A illustrates a configuration capable of changing the harmonic distortion control voltage Vg from 0.4V to 0.8V, and the graph g21 corresponds to a scenario in which the harmonic distortion control voltage Vg is changed from 0.2V to 0.8V.

The harmonic distortion control voltage Vg is applied between the gate and source of the transistor M1 of the multiple wave output unit 111a. Accordingly, by changing the harmonic distortion control voltage Vg, harmonic distortion of the transistor M1 changes so that the output level of each multiple wave included in an input signal changes according to the harmonic distortion. For example, referring to the example of FIG. 4B, when the harmonic distortion control voltage Vg changes from 0.2V to 0.8V, the amplitude value of the signal fTX after modulation changes between 390 mVpp and 780 mVpp. That is, when a voltage applied between the gate and source of the transistor M1 of the multiple wave output unit 111a changes by adjusting the harmonic distortion control voltage Vg, harmonic distortion of the transistor M1 changes accordingly.

As illustrated in FIG. 4B, the amplitude value of the signal fTX after modulation becomes a maximum at a harmonic distortion control voltage Vg of 0.4V, and as the harmonic distortion control voltage Vg increases from 0.4V to 0.8V, the amplitude value of the signal fTX decreases gradually. A difference ΔGv between the amplitude value of the signal fTX at Vg=0.4V and the amplitude value of the signal fTX at Vg=0.8V is greater than 6 dB (ΔGv>6 dB).

As described above, by configuring the harmonic distortion controller 12a such that a harmonic distortion control voltage Vg can be adjusted in the range of 0.4V to 0.8V, it is possible to realize a variable gain range above 6 dB.

Figure 5:
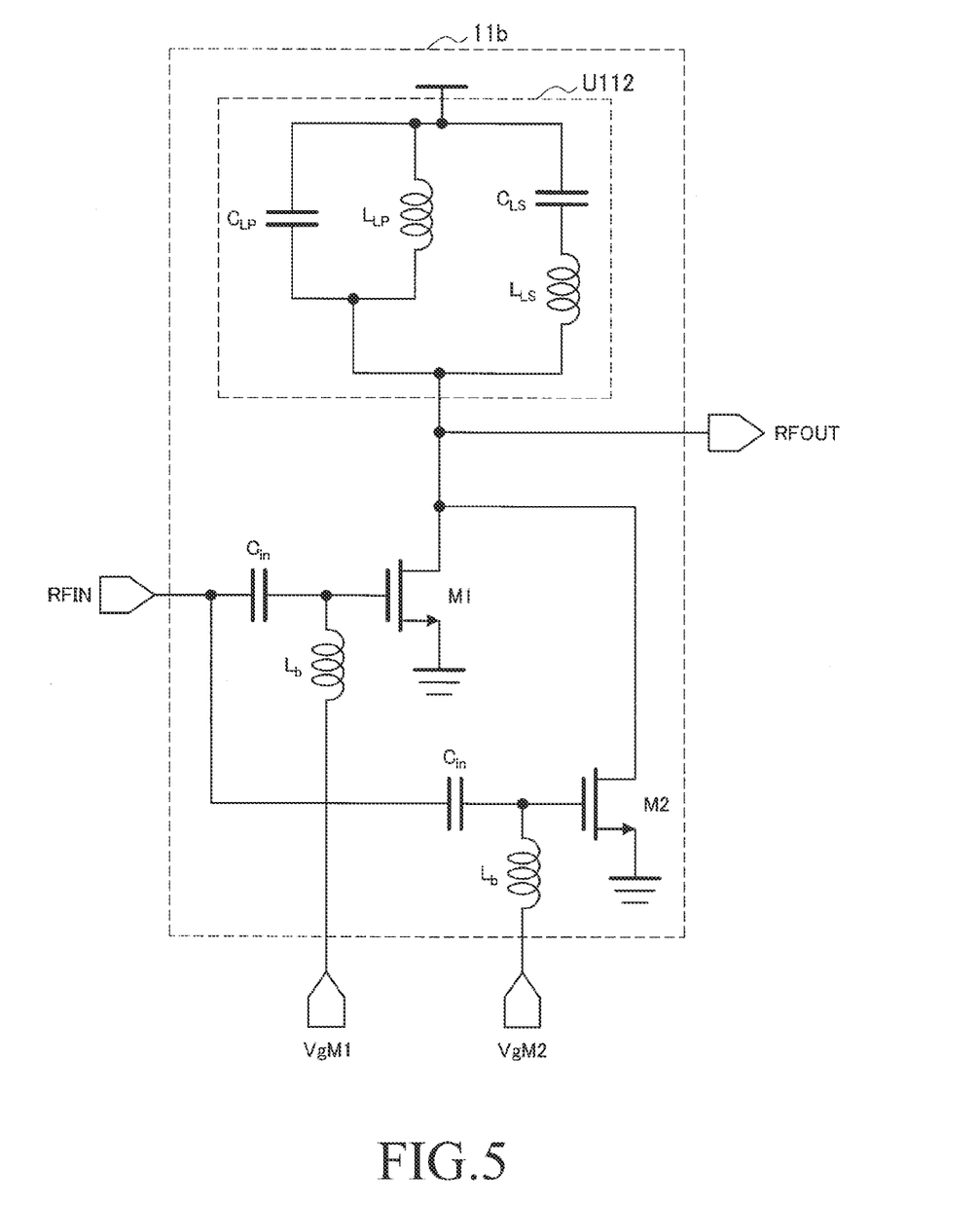
FIG. 5 illustrates a circuit diagram of a multiplier circuit according to an embodiment of the present invention.

FIG. 5 is a circuit diagram of a multiplier circuit according to an embodiment of the present invention.

Referring to FIG. 5, a multiplier circuit 11b, which is different from the multiplier circuit 11 illustrated in FIG. 3B, includes a sub transistor M2 and a transistor M1. Accordingly, the configuration of the sub transistor M2 will be described, and detailed descriptions about the same components as those included in the multiplier circuit 11 of FIG. 3B will be omitted.

The sub transistor M2 is connected in parallel to the transistor M1. More specifically, the drain of the transistor M1 is connected to the drain of the sub transistor M2. Like the transistor M1, an input signal received through an input terminal RFIN is transferred to the gate of the sub transistor M2 via a capacitor $C_{in}$. The source of the sub transistor M2 is grounded.

In the multiplier circuit 11b, voltages VgM1 and VgM2, which can be independently controlled through inductors $L_b$, are respectively applied to the gates of the transistor M1 and the sub transistor M2. As the voltage VgM1, like the multiplier circuit 11 of FIG. 3B, a harmonic distortion control voltage Vg generated by the harmonic distortion controller 12 is applied to the transistor M1.

As described above, because the voltages VgM1 and VgM2 can be independently controlled, transistors having the same properties may be used as the transistor M1 and the sub transistor M2. If the same harmonic distortion control voltage Vg is applied to the transistor M1 and the sub transistor M2, the transistor M1 and the sub transistor M2 may enhance a multiple wave n*fOSC multiplied by a desired multiplication number n. However, transistors having different properties may be used as the transistor M1 and the sub transistor M2, or a different voltage from the harmonic distortion control voltage Vg may be applied to the sub transistor M2. In this way, by independently controlling the transistor M1 and the sub transistor M2, it is possible to remove unnecessary multiple waves while enhancing a desired multiple wave.

The remaining components in FIG. 5 operate in the same way as in the multiplier circuit 11 illustrated in FIG. 3B.

In accordance with another embodiment of the present invention, the multiplier circuit 11b of FIG. 5 may be substituted for the multiplier circuit 11a in the frequency multiplier 10a illustrated in FIG. 4A. Although not illustrated, when the multiplier circuit 11b of FIG. 5 is substituted for the multiplier circuit 1 la in the frequency multiplier 10a illustrated in FIG. 4A, the frequency multiplier will be referred to as a frequency multiplier 10b, and the filter will be referred to as a filter 112b.

Figure 6A:
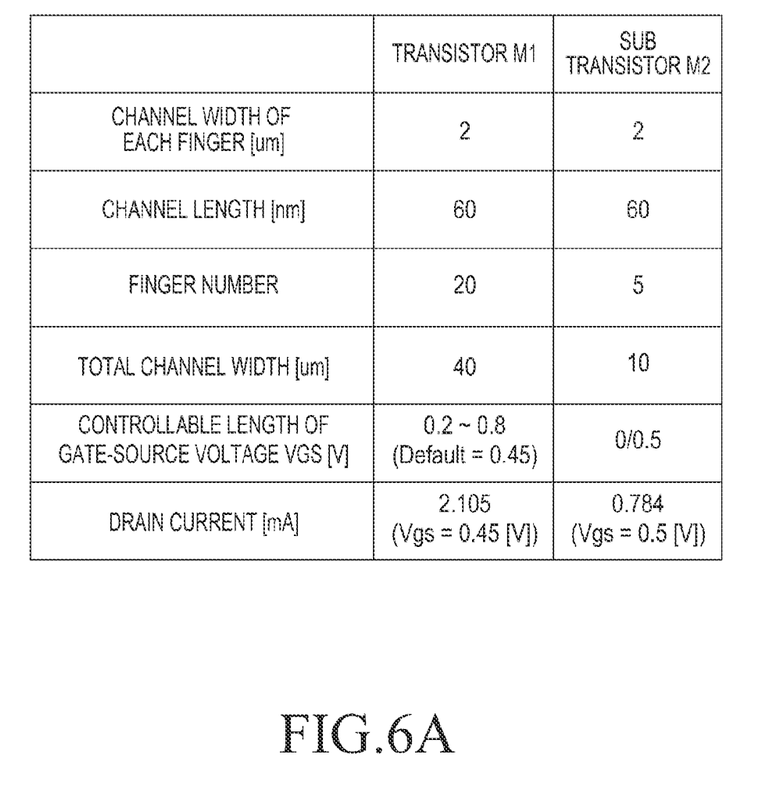
FIG. 6A illustrates a table of parameters of transistors included in a multiplier circuit according to an embodiment of the present invention.

FIG. 6A illustrates a table of parameters of transistors included in a multiplier circuit according to an embodiment of the present invention. Specifically, FIG. 6A illustrates a table showing parameters of the transistors M1 and M2 (e.g., multi-finger type transistors) included in the multiplier circuit 11b illustrated in FIG. 5.

Referring to FIG. 6A, the transistor M1 has a finger number of 20 (k=20), and each finger has a channel width of 2 um (Wu=2 um) and a channel length of 60 nm (L=60 nm) That is, the total channel width Wtotal of the transistor M1 is 40 um (Wtotal=Wu*k=40 um). A voltage VgM1 ranging from 0.2V to 0.8V is applied as a gate-source voltage Vgs to the transistor M1. The default value of the voltage VgM1 is set to 0.45V, and drain current Id at the voltage of 0.45V was measured to be 2.105 mA.

The sub transistor M2 has a finger number of 5 (k=5), and each finger has a channel width of 2 um (Wu=2 um) and a channel length of 60 nm (L=60 nm) That is, the total channel width Wtotal of the transistor M2 is 10 um (Wtotal=Wu*k=10 um). A voltage VgM2 of 0V or 0.5V is applied as a gate-source voltage Vgs to the transistor M2. When the voltage VgM2 of 0.5V was applied to the transistor M2, drain current Id was measured to be 0.784 Ma.

The frequency multiplier 10b receives an input signal of a reference wave fOSC having a frequency of 40 GHz, and outputs a frequency-doubled wave 2*fOSC (80 GHz) multiplied by a multiplication number 2 (n=2). Accordingly, the filter 112b is adjusted to remove a frequency component at or near 40 GHz corresponding to the reference wave fOSC, and to pass a frequency component at or near 80 GHz corresponding to the frequency-doubled wave 2*fOSC.

Figure 6B:
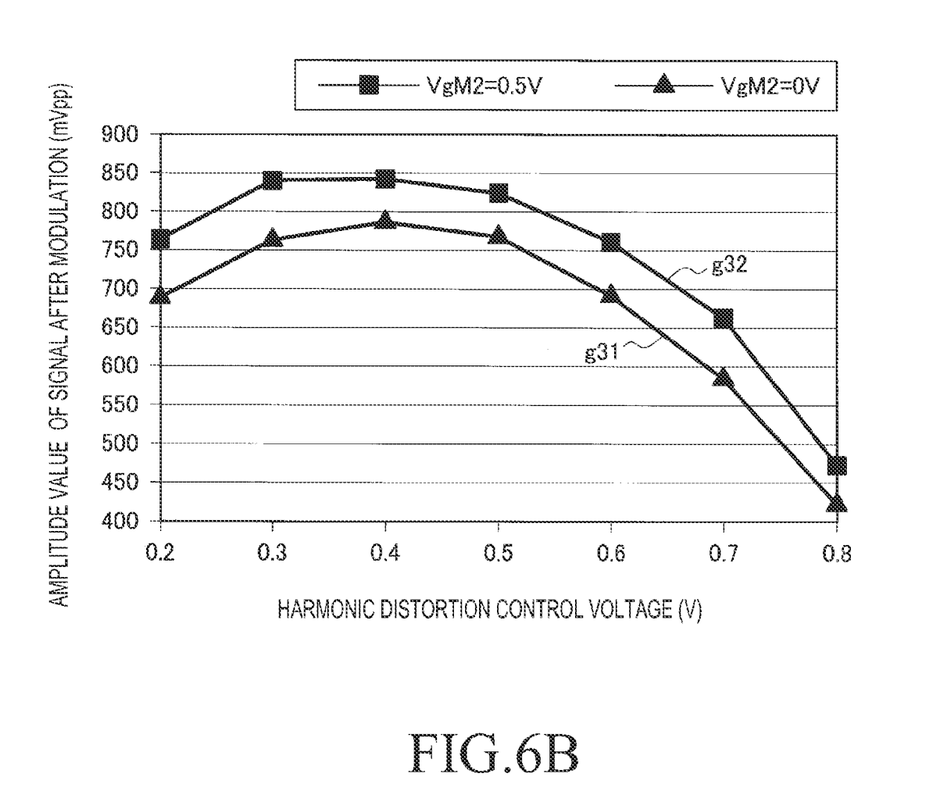
FIG. 6B is a graph illustrating changes in amplitude values of an output signal after modulation with respect to changes of a harmonic distortion control voltage in a wireless communication apparatus including the multiplier circuit according to an embodiment of the present invention.

FIG. 6B is a graph illustrating changes in amplitude values of an output signal after modulation with respect to changes of a harmonic distortion control voltage in a wireless communication apparatus including the multiplier circuit according to an embodiment of the present invention.

Referring to FIG. 6B, graphs g31 and g32 show changes in amplitude values of an output signal after modulation with respect to changes of a harmonic distortion control voltage in the wireless communication apparatus. The horizontal axis represents a voltage VgM1 that is applied to the transistor M1, i.e., a harmonic distortion control voltage Vg. The graphs g31 and g32 correspond to the scenario of changing the harmonic distortion control voltage Vg in a pitch of 0.1V in the range of 0.2V to 0.8V.

The vertical axis represents the amplitude value [mVpp] of a signal fTX after modulation, i.e., the amplitude value of a signal obtained after an output signal (a frequency-doubled wave 2*fOSC) of the frequency multiplier 10a is modulated by the modulator 20.

In FIG. 6B, the graph g31 corresponds to a scenario in which a voltage VgM2 of 0V is applied between the gate and source of the sub transistor M2, i.e., a scenario in which no voltage is applied between the gate and source of the sub transistor M2, and the graph g32 corresponds to a scenario in which a voltage VgM2 of 0.5V is applied between the gate and source of the sub transistor M2.

As can be seen from the graphs g31 and g32, when a voltage VgM2, which is applied between the gate and source of the transistor M2, increases from 0V to 0.5V, the amplitude value of a signal fTX after modulation increases proportionally because a harmonic distortion coefficient gm-$2^{nd}$ of $2^{nd}$ harmonics in the sub transistor M2 increases, and the amplitude value of a frequency-doubled wave 2*fOSC increases when the sub transistor M2 operates.

Current increases, due to the operation of the sub transistor M2, and the increased amount of current corresponds to drain current (id=0.784 mA) of the sub transistor M2. The sub transistor M2, which is additionally used for making distortion, may be embodied as a small-sized transistor with low consumption power.

By providing the sub transistor M2 connected in parallel to the transistor M1, it is possible to accurately control or widen a variable gain range compared to when only the transistor M1 is provided. For example, by discretely switching a voltage VgM2 that is applied between the gate and source of the sub transistor M2, discrete variable gain control is possible as seen in the graphs g31 and g32. Also, analog-control on the voltage VgM2 is possible. Accordingly, it is possible to obtain a wider variable gain range than when only the transistor M1 is used, and to continuously change a gain in the variable gain range. Further, the sub transistor M2 can perform gain control with a small amount of current since it can maintain low consumption power.

Figure 7:
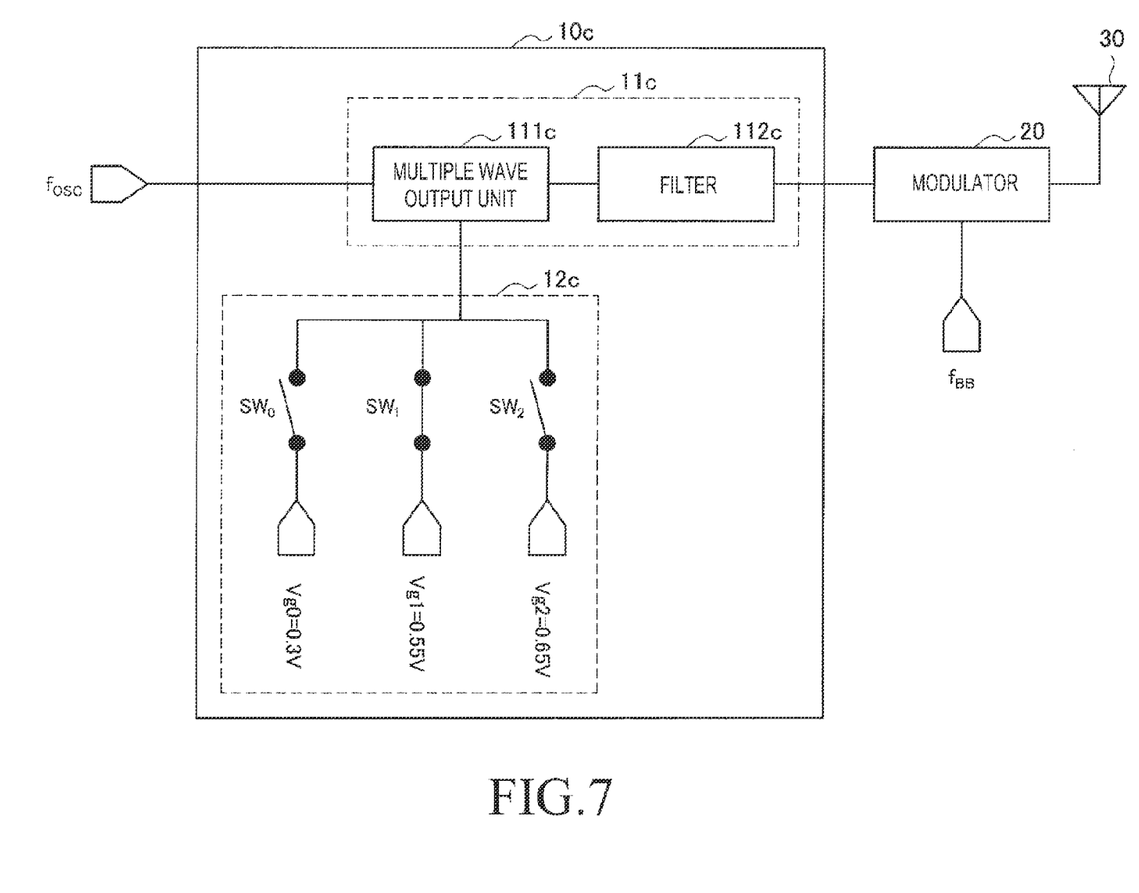
FIG. 7 illustrates a wireless communication apparatus according to an embodiment of the present invention.

FIG. 7 illustrates a wireless communication apparatus according to an embodiment of the present invention.

Referring to FIG. 7, a configuration of a frequency multiplier 10c, which operates differently from the frequency multiplier 10 illustrated in FIG. 1, will be described. Further, detailed descriptions of a modulator 20 and a transmitter 30 that operate in the same manner as in FIG. 1 will be omitted.

The frequency multiplier 10c outputs a desired multiple wave, thereby outputting a carrier wave of a desired frequency to the modulator 20. The frequency of a reference wave fOSC may vary. For example, in order to output a carrier wave of 80 GHz, a frequency-doubled wave 2*fOSC or a frequency-tripled wave 3*fOSC may be used. When a frequency-doubled wave 2*fOSC is used to output a carrier wave of 80 GHz, the frequency of the reference wave fOSC is set to 40 GHz. When a frequency-tripled wave 2*fOSC is used to output a carrier wave of 80 GHz, the frequency of the reference wave fOSC is set to 26.667 GHz.

In the following description, for convenience of description, when the frequency of a reference wave fOSC of an input signal is set to 30 GHz, a frequency-doubled wave 2*fOSC is used to output a carrier wave of 60 GHz, and a frequency-tripled wave 3*fOSC is used to output a carrier wave of 90 GHz.

Referring to FIG. 7, a multiplier circuit 11c has the same configuration as the multiplier circuit 11 illustrated in FIG. 3B. Also, a multiplication output unit 111c corresponds to the transistor M1 (and circuits associated with inputs to or outputs from the transistor MD illustrated in FIG. 3B, and a filter 112c corresponds to the circuitry group U112 illustrated in FIG. 3B. A transistor M included in the multiplier circuit 11c is a transistor in which a harmonic distortion coefficient gm-$2^{nd}$ of $2^{nd}$ harmonics becomes an extreme value (a maximum value) when a gate-source voltage Vgs (i.e., a harmonic distortion control voltage Vg) is 0.55V. Also, in the transistor M1, when a gate-source voltage Vgs is 0.3V and 0.65V, a harmonic distortion coefficient gm-$3^{rd}$ of $3^{rd}$ harmonics becomes extreme values (a maximum value and a minimum value).

A harmonic distortion controller 12c adjusts the harmonic distortion control voltage Vg to 0.3V, 0.55V, or 0.65V according to the properties of the transistor M1.

Referring to FIG. 7, the harmonic distortion controller 12 includes a plurality of switches $SW_0$, $SW_1$, and $SW_2$, to which different voltages Vg0, Vg1, and Vg2 are respectively applied, based on the on-off operations of the switches $SW_0$, $SW_1$, and $SW_2$. Further, Vg0=0.3V, Vg1=0.55V, and Vg2=0.65V. Accordingly, by turning on/off the switches $SW_0$, $SW_1$, and $SW_2$, a voltage applied to a line having a turned-on switch among the voltages Vg0, Vg1, and Vg2 is supplied as a harmonic distortion control voltage Vg to the multiple wave output unit 111c.

More specifically, when the switch $SW_1$ is turned on, a voltage Vg1 of 0.55V is applied as a harmonic distortion control voltage Vg from the harmonic distortion controller 12a to the transistor M1 of the multiple wave output unit 111c. In this case, the amplitude value of a frequency-doubled wave 2*fOSC is enhanced by the transistor M1.

If the switch $SW_0$ is turned on, a voltage Vg0 of 0.3V is applied as a harmonic distortion control voltage Vg from the harmonic distortion controller 12a to the transistor M1 of the multiple wave output unit 111c. In this case, the amplitude value of a frequency-tripled wave 3*fOSC is enhanced by the transistor M1. When the switch $SW_2$ is turned on, a voltage Vg2 of 0.65V is applied as a harmonic distortion control voltage Vg to the transistor M1. In this case, the amplitude value of a frequency-tripled wave 3*fOSC is enhanced by the transistor M1.

The filter 112c passes or removes a specific frequency component according to a harmonic distortion control voltage Vg output from the harmonic distortion controller 12c. For example, when the switch $SW_1$ of the harmonic distortion controller 12c is turned on so that a frequency-doubled wave 2*fOSC of 60 GHz is enhanced and output from the multiple wave output unit 111c, the filter 112c is adjusted to pass a frequency component of 60 GHz corresponding to the frequency-doubled wave 2*fOSC and remove other frequency components (for example, a reference wave fOSC or a frequency-tripled wave 3*fOSC).

Similarly, when the switch $SW_0$ or $SW_2$ of the harmonic distortion controller 12c is turned on so that a frequency-tripled wave 3*fOSC of 90 GHz is enhanced and output from the multiple wave output unit 111c, the filter 112c is adjusted to pass a frequency component of 90 GHz corresponding to the frequency-tripled wave 3*fOSC and remove other frequency components (for example, a reference wave fOSC or a frequency-doubled wave 2*fOSC).

In the example of FIG. 3B, the SRFs of the LC series circuit $C_{LS}L_{LS}$ and the LC parallel circuit $C_{LP}L_{LP}$ constructing the circuitry group U112 are adjusted. For example, by digitally changing the capacitor $C_{LS}$ of the LC series circuit $C_{LS}L_{LS}$ to change the SRF of the LC series circuit $C_{LS}L_{LS}$, a frequency component to remove can be changed. Also, by digitally changing the capacitor $C_{LP}$ of the LC parallel circuit $C_{LP}L_{LP}$ to change the SRF of the LC parallel circuit $C_{LP}L_{LP}$, a frequency component to pass can be changed.

It is also possible to change the frequency of the reference wave fOSC, as described above. In this case, the filter 112c is adjusted to remove, when the frequency of the reference wave fOSC has changed, a frequency component corresponding to the changed reference wave fOSC.

Accordingly, the harmonic distortion controller 12c may selectively output a multiple wave multiplied by a desired multiplication number among a plurality of multiple waves (for example, a frequency-doubled wave and a frequency-tripled wave). Further, because it is possible to change the frequency of a reference wave fOSC, a wireless communication apparatus capable of outputting carrier waves of various frequencies is provided with a low difficulty level of design.

While the present invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A multiplier circuit comprising:
a multiple wave output unit configured to receive an input signal of a predetermined frequency, to output a multiple wave that is a predetermined multiple of the input signal, and control harmonic distortion associated with the output of the multiple wave based on a gate-source voltage; and
a controller configured to include a plurality of switches to which different voltages are respectively applied, and to adjust the gate-source voltage by supplying a voltage corresponding to a turned-on switch among the switches as the gate-source voltage,
wherein the multiple wave output unit comprises a transistor and a sub transistor connected in parallel to the transistor, and
wherein the harmonic distortion is controlled by adjusting the gate-source voltage that is applied to the transistor and the sub transistor.

2. The multiplier circuit of claim 1, wherein the controller is configured to adjust the gate-source voltage in a predetermined range, and
wherein the multiple wave output unit sets the harmonic distortion to a value corresponding to the gate-source voltage.

3. The multiplier circuit of claim 1, wherein the amplitude value of the multiple wave is adjusted to a desired range by controlling the harmonic distortion.

4. The multiplier circuit of claim 1, further comprising a filter disposed behind the multiple wave output unit, and configured to pass a frequency component corresponding to at least the multiple wave.

5. The multiplier circuit of claim 4, wherein the filter blocks a frequency component corresponding to the input signal.

6. A wireless communication apparatus comprising:
an oscillator configured to output an input signal of a predetermined frequency;
a multiple wave output unit configured to receive the input signal, to output a multiple wave that is a predetermined multiple of the input signal, and to control harmonic distortion associated with the output of the multiple wave based on a gate-source voltage;
a controller configured to include a plurality of switches to which different voltages are respectively applied, and to adjust the gate-source voltage by supplying a voltage corresponding to a turned-on switch among the switches as the gate-source voltage; and
a modulator configured to modulate a desired base-band signal using the multiple wave as a carrier wave,
wherein the multiple wave output unit comprises a transistor and a sub transistor connected in parallel to the transistor, and
wherein the harmonic distortion is controlled by adjusting the gate-source voltage that is applied to the transistor and the sub transistor.

7. The wireless communication apparatus of claim 6, wherein the oscillator is configured to control the frequency of the input signal.

8. The wireless communication apparatus of claim 6, further comprising a filter configured to block a predetermined frequency component, and to block a frequency component corresponding to the input signal whose frequency has been controlled by the oscillator.

* * * * *